United States Patent
Böcherer et al.

(10) Patent No.: US 10,826,648 B2
(45) Date of Patent: Nov. 3, 2020

(54) METHODS OF CONVERTING OR RECONVERTING A DATA SIGNAL AND METHOD AND SYSTEM FOR DATA TRANSMISSION AND/OR DATA RECEPTION

(71) Applicant: Technische Universität München, Munich (DE)

(72) Inventors: Georg Böcherer, Munich (DE); Patrick Schulte, Munich (DE); Fabian Steiner, Übersee (DE)

(73) Assignee: Technische Universität München, Munich (DE)

( * ) Notice: Subject to any disclaimer, the term of this patent is extended or adjusted under 35 U.S.C. 154(b) by 0 days.

(21) Appl. No.: 16/477,634

(22) PCT Filed: Jan. 16, 2018

(86) PCT No.: PCT/EP2018/050939
§ 371 (c)(1),
(2) Date: Jul. 12, 2019

(87) PCT Pub. No.: WO2018/134179
PCT Pub. Date: Jul. 26, 2018

(65) Prior Publication Data
US 2019/0342031 A1    Nov. 7, 2019

(30) Foreign Application Priority Data

Jan. 18, 2017 (EP) ..................................... 17151917

(51) Int. Cl.
*H04L 1/00* (2006.01)
*H04L 27/36* (2006.01)
*H04L 27/38* (2006.01)

(52) U.S. Cl.
CPC .......... *H04L 1/0042* (2013.01); *H04L 1/0045* (2013.01); *H04L 27/36* (2013.01); *H04L 27/38* (2013.01)

(58) Field of Classification Search
CPC ..... H04L 1/0042; H04L 1/0045; H04L 27/36; H04L 27/38
See application file for complete search history.

(56) References Cited

U.S. PATENT DOCUMENTS

| | | |
|---|---|---|
| 5,388,124 A | 2/1995 | Laroia et al. |
| 6,061,407 A | 5/2000 | Cherubini et al. |

(Continued)

FOREIGN PATENT DOCUMENTS

| | | |
|---|---|---|
| EP | 3306821 A1 | 4/2018 |
| WO | WO 02/15443 A1 | 2/2002 |

OTHER PUBLICATIONS

Amjad, Rana Ali, "Algorithms for Simulation of Discrete, Memoryless Sources," a master's thesis presented to Technische Universität München Lehrstuhl für Nachrichtentechnik, Oct. 29, 2013, 75 pages.

(Continued)

*Primary Examiner* — David S Huang
(74) *Attorney, Agent, or Firm* — Dascenzo Gates Intellectual Property Law, P.C.

(57) ABSTRACT

Methods (C) for converting a data signal (U), comprising processes of (i) providing an input symbol stream (IB) of input symbols (IBj), the input symbol stream (IB) being representative for the underlying data signal (U) to be converted, and (ii) applying a distribution matching process to consecutive partial input symbol sequences ($IB^k$) of a number of k consecutive input symbols (IBj) covering said input symbol stream (IB). The distribution matching process (DM) generates and outputs a final output symbol stream (OB) of consecutive output symbols (OBj) or a preform (Continued)

thereof, wherein the distribution matching process (DM) is based on and/or comprises a family $((f_i)_{i \in \{0, 1, \ldots, n-1\}})$ of a number (n) of distribution matching functions $(f_i)$, the action of the distribution matching process (DM) is achieved by acting with one of said distribution matching functions $(f_i)$ selected from said family $((f_i)_{i \in \{0, 1, \ldots, n-1\}})$ on said partial input symbol sequences $(IB^k)$, and wherein selecting a distribution matching function $(f_i)$ from said family $((f_i)_{i \in \{0, 1, \ldots, n-1\}})$ is based on a set of rules comprising at least one selection rule.

23 Claims, 7 Drawing Sheets

(56) References Cited

U.S. PATENT DOCUMENTS

| | | | |
|---|---|---|---|
| 7,778,341 | B2 | 8/2010 | Tong et al. |
| 8,625,688 | B2 | 1/2014 | Yeh et al. |
| 9,077,508 | B2 | 7/2015 | Koike-Akino et al. |
| 9,621,275 | B2 | 4/2017 | Kojima et al. |
| 2004/0093545 | A1 | 5/2004 | Khandani et al. |
| 2007/0283182 | A1 | 12/2007 | Defazio et al. |
| 2010/0303171 | A1 | 12/2010 | Tong et al. |
| 2011/0267210 | A1 | 11/2011 | Risbo et al. |
| 2013/0235744 | A1 | 9/2013 | Chen et al. |
| 2016/0309274 | A1 | 10/2016 | Ma et al. |
| 2019/0342138 | A1 | 11/2019 | Böcherer et al. |
| 2020/0052713 | A1 | 2/2020 | Böcherer et al. |
| 2020/0092009 | A1 | 3/2020 | Böcherer et al. |

OTHER PUBLICATIONS

Blahut, Richard E., "Computation of Channel Capacity and Rate-Distortion Functions," *IEEE Transactions on Information Theory* (Jul. 1972), vol. 18, No. 4, pp. 460-473.

Böcherer et al., "Bandwidth Efficient and Rate-Matched Low-Density Parity-Check Coded Modulation," *IEEE Transactions on Communications* (Dec. 2015), vol. 63, No. 12, pp. 4651-4665.

Böcherer et al., "Block-to-Block Distribution Matching," *arXiv:1302.1020* (Feb. 5, 2013), 5 pages.

Böcherer, Georg, "Capacity-Achieving Probabilistic Shaping for Noisy and Noiseless Channels," a doctoral dissertation presented to Rheinisch-Westfälischen Technischen Hochschule Aachen, Feb. 13, 2012.

Buchali et al., "Rate Adaptation and Reach Increase by Probabilistically Shaped 64-QAM: An Experimental Demonstration," *Journal of Lightwave Technology* (Apr. 1, 2016), vol. 34, No. 7, pp. 1599-1609.

Eyuboglu, et al., "Advanced Modulation Techniques for V.Fast," *European Transactions on Telecommunications and Related Technologies* (1993), vol. 4, No. 3, pp. 243-256.

Kschischang, Frank R., "Optimal Nonuniform Signaling for Gaussian Channels," *IEEE Transactions on Information Theory* (May 1993), vol. 39, No. 3, pp. 913-929.

Schulte et al., "Constant Composition Distribution Matching," *IEEE Transactions on Information Theory* (Jan. 2016), vol. 62, No. 1, pp. 430-434.

Sterian, et al., "Reducing the peak and average power for ODFM systems using QA by constellation shaping" *European Transactions on Telecommunications* (Apr. 28, 2009), vol. 21, pp. 35-49.

Fig. 9 - Table 1

| t | $n_{in}(t-1)$ | $n_{out}(t-1)$ | $\omega(t-1)$ | $f(t)$ | processed input | processed output |
|---|---|---|---|---|---|---|
| 1 | 0 | 0 | 0 | $f_0$ | $\varepsilon$ | 00 |
| 2 | 0 | 2 | 1 | $f_1$ | 0 | 0000 |
| 3 | 1 | 4 | 1 | $f_1$ | 011 | 000010 |
| 4 | 3 | 6 | 0 | $f_0$ | 011 | 00001000 |
| 5 | 3 | 8 | 1 | $f_1$ | 0110 | 0000100000 |
| 6 | 4 | 10 | 1 | $f_1$ | 011010 | 000010000001 |

METHODS OF CONVERTING OR RECONVERTING A DATA SIGNAL AND METHOD AND SYSTEM FOR DATA TRANSMISSION AND/OR DATA RECEPTION

The present invention refers to methods for converting or reconverting a data signal and to a method and a system for data transmission and/or data reception.

In the field of converting, transmitting and/or receiving data signals over certain kinds of channels in order to communicate symbol sequences a certain degree of power consumption is accompanied with the underlying processes which shall be kept as low as possible. In addition, difficulties occur in case of high data loads under streaming conditions.

The publications "Block-to-block distribution matching" by Böcherer and Amjad, 2013, and "Algorithms for simulation of discrete memory-less sources" Amjad, 2013, both describe variable-to-fixed length distribution matcher which are chosen in a predetermined and fixed manner.

It is an object underlying the present invention to present methods of converting or reconverting data signals and methods and systems for data transmission and/or data reception with an increased reliability of the underlying processes under reduced power consumption, at least improved power efficiency and improved streaming capabilities.

The object underlying the present invention is achieved by a method for converting a data signal according to independent claim 1 or alternatively by a method according to independent claim 8, by a method for data transmission and/or data reception according to independent claim 16 and by a data transmission and/or reception system according to independent claim 18. Preferred embodiments are defined in the respective dependent claims.

According to a first aspect of the present invention a method for converting a data signal is provided which comprises processes providing an input symbol stream of input symbols, the input symbol stream being representative for the underlying data signal to be converted and applying to consecutive partial input symbol sequences of a number of k consecutive input symbols covering said input bit stream, with k being a—not necessarily fixed—natural number, a distribution matching process in order to generate and output a final output symbol stream of consecutive output symbols or a preform thereof, wherein the distribution matching process is based on and/or comprises a family of a number of distribution matching functions, the action of the distribution matching process is achieved by acting with one of said distribution matching functions selected from said family on said partial input symbol sequences and wherein selecting a distribution matching function from said family is based on and in particular controlled by a set of rules comprising at least one selection rule.

It is therefore a key aspect of the present invention to design the distribution matching process as or based on a family of distribution matching functions which are conditionally selected for processing by using a set of selection rules. These measures allow a comparable flexible handling of the symbol processing in order to achieve desired transfer rates and/or symbol distributions.

According to a preferred embodiment of the method for converting a data signal at least one of the processes of (i) providing the input symbol stream, (ii) applying said distribution matching process, (iii) selecting a distribution matching function from said family and (iv) acting with a distribution matching function on the input symbol stream may be performed in a continuously clocked and/or streaming manner in particular in order to fulfill data conversion and data transmission for achieving streaming conditions with high data transfer and/or processing rates.

Additionally or alternatively, a respective selection rule and in particular the entire set of selection rules may be based on and/or may be designed in order to be descriptive and/or representative for at least one of (a) said input symbol stream and/or said partial sequences thereof and in particular for one or plural input symbols already received or read as input, (b) said output symbol stream and/or partial sequences thereof and in particular for one or plural output symbols already transferred or written as output, (c) one present and/or at least one past state of an underlying input buffer, (d) one present and/or at least one past state of an output buffer, (e) a given distribution of the input symbols, (f) a distribution of the output symbols achieved or to be achieved, in particular at least approximatively within a given range, and (g) a rate as a ratio of the number of received input symbols and the number of transferred output symbols achieved or to be achieved, in particular globally and/or for a clock or a plurality of clocks, (h) wherein a particular rate is equal or proportional to the empirical entropy of the distribution of the output symbols.

In order to increase flexibility of the method for converting a data signal, in particular in view of certain data rates and/or data distribution, said distribution matching process may have or may be based on an input alphabet and an output alphabet.

In particular, each of said distribution matching functions of said family may have or may be based on a respective input alphabet and a respective output alphabet, which are in particular individual for each of said distribution matching functions.

Respective input and output alphabets of the distribution matching functions may consist of words whose letters are in said input alphabet and said output alphabet, respectively, underlying the distribution matching process, respectively. However, this is not a mandatory requirement.

According to another advantageous embodiment of the method of converting a data signal the distribution matching process, the distribution matching functions and/or the selection rules may be configured such that the output symbol stream at least approximates a desired underlying distribution and/or fulfills at least approximatively a desired rate when compared to the input symbol stream, the input symbol stream is processed in the form of partial sequences having a number k of consecutive input symbols covering said input symbol stream, with k being a—not necessarily fixed—natural number, and/or the output symbol stream is output in the form of partial sequences having a number k' of consecutive output symbols covering said output symbol stream, with k' being a—not necessarily fixed—natural number.

According to another preferred embodiment the distribution matching process, the distribution matching functions and/or the selection rules are configured such that an achieved current transfer or transmission rate R, a current accumulated number $n_{in}(t)$ of processed input symbols and the current accumulated number $n_{out}(t)$ of processed output symbols at a given time or clock t may fulfill the following relation $$W\min \leq R \cdot n_{out}(t) - n_{in}(t) \leq W\max,$$

wherein Wmin and Wmax are predefined and fixed threshold values, in particular describing a minimum and a maximum buffer filling state, respectively.

The inventive method for converting a data signal may preferably be combined with certain error correction processes.

Therefore, the distribution matching process may be followed by a forward error correction encoding process, in particular within a probabilistic amplitude shaping process, and/or by a modulation process, in particular a QAM modulation process, preferably in this order.

According to a further aspect of the present invention a method for reconverting a data signal is provided, too, in particular regarding a data signal which has been previously converted by using the inventive method for converting a data signal as described above.

Said method for reconverting a data signal comprises processes of
providing an input symbol stream of input symbols, the input symbol stream—directly or indirectly—being representative for an underlying—in particular converted—data signal to be reconverted or a derivative thereof, and
applying to said input symbol stream or to a derivative thereof an inverse distribution matching process in order to generate and output a final output symbol stream,
wherein
the inverse distribution matching process is based on and/or comprises a family of a number (n) of inverse distribution matching functions,
the action of the inverse distribution matching process is achieved by acting with one of said inverse distribution matching functions selected from said family on the input symbol stream and/or its consecutive partial input symbol sequences and
wherein selecting an inverse distribution matching function from said family is inherently realized, based on, and in particular controlled by an underlying set of rules comprising at least one selection rule for an underlying family of distribution matching functions for a distribution matching process at a transmitter side.

In a similar manner as for the inventive method for converting a data signal the processes of
(i') providing the input symbol stream,
(ii') applying said inverse distribution matching process,
(iii') inherently selecting an inverse distribution matching function from said family and
(iv') acting with an inverse distribution matching function on the input symbol stream
of the inventive method of reconverting a data signal may be performed in a continuously clocked and/or streaming manner.

Preferably, the inverse distribution matching process may have or may be based on an input alphabet and an output alphabet, which are in particular identical to an output alphabet and an input alphabet, respectively, of an underlying distribution matching process at a transmitter side.

In particular, each of said inverse distribution matching functions of said family may have or may be based on an input alphabet and an output alphabet, which are in particular individual for each of said inverse distribution matching functions, underlying the inverse distribution matching process, and/or which are in particular identical to respective output alphabets and input alphabets of underlying distribution matching functions for a distribution matching process at a transmitter side.

Again, the respective input and output alphabets of the inverse distribution matching functions of the inverse distribution matching process may consist of words with letters in said input alphabet and said output alphabet, respectively, underlying the inverse distribution matching process, respectively. However, this is again not a mandatory requirement.

Additionally or alternatively, the inverse distribution matching process, the inverse distribution matching functions and/or the underlying inherently followed selection rules may be configured such that
the output symbol stream at least approximates a uniform distribution and/or fulfills at least approximately a desired rate when compared to the input symbol stream,
the input symbol stream is processed in the form of partial sequences having a number k' of consecutive input symbols covering said input symbol stream, with k' being a—not necessarily fixed—natural number, and/or
the output symbol stream is output in the form of partial sequences having a number k of consecutive output symbols covering said output symbol stream, with k being a—not necessarily fixed—natural number.

Again, the method for reconverting a data signal may be combined with certain error correction techniques.

Thus, the inverse distribution matching process may follow a demodulation process, in particular a QAM demodulation, and/or a forward error correction decoding process, in particular within an inverse probabilistic amplitude shaping process, preferably in this order.

In the following, further aspects are described which can be applied to the method for converting a data signal as well as to the method for reconverting a data signal, both according to the present invention:

First of all, the distribution matching process and/or the inverse distribution matching process are formed by a plurality of partial distribution and partial inverse distribution matching processes, respectively, which are in particular respectively configured in order to act in parallel and/or based on a shared input and/or output buffer unit.

Additionally or alternatively, said distribution matching processes and said inverse distribution matching processes, and in particular said underlying distribution matching functions and inverse distribution matching functions, said forward error correction encoding and decoding processes, and said modulation and demodulation processes may be configured to be invertible, respectively, with respect to each other.

The process of providing the input bit stream may comprise at least one of recalling the input symbol stream from a storage medium or from a symbol generation process and of receiving, demodulating and/or decoding a signal being representative for or conveying the input symbol stream.

According to a further preferred embodiment of the methods for converting and/or reconverting a data signal, said distribution matching processes, said inverse distribution matching processes, said modulation process and/or said demodulation processes may be at least one of based on and chosen (a') according to a predefined distribution to be achieved for an output and in particular based on a Gaussian distribution, and (b') in order to achieve an approximation of a desired distribution of the final output symbol stream to the respective underlying distribution by accordingly indexing the respective output sequences out of a respective entire set of candidates.

Although the general concept may be realized in the context of arbitrary symbols, said input symbol stream and/or the output symbol stream may be at least partially formed and/or represented by binary bits.

Consequently, each stage and even intermediate stages of the process according to the present invention may either refer to more general symbols or to bits and bit combinations as symbols.

According to another aspect of the present invention a method for data transmission and/or data reception is provided.

The inventive method comprises at least one of a data transmission section and a data reception section. The data transmission section and/or the data reception section may involve at least one of the inventive methods for converting data signal or for reconverting a data signal as described above.

In a preferred embodiment of the inventive method for data transmission and/or data reception, involved distribution matching process and the inverse distribution matching processes may be invertible or inverse with respect to each other.

A data transmission and/or data reception system is suggested by the present invention, too.

The inventive system comprises a processing unit configured to perform any of the methods according to the present invention and comprises respective means for carrying out such methods.

In case of a combination of a transmission process/unit and a reception process/unit, these processes or units may be configured to exchange and/or negotiate data in order to define and fix the concrete form of the streaming distribution matching, forward error correction encoding/decoding and/or modulator and demodulator properties.

Furtheron, the inventive methods as described above may be realized by a code acceptable and executable by a computer or a digital signal processing means.

Also within the scope of the present invention, a computer program product is provided, comprising a computer code adapted to let a computer and/or a digital signal processing means execute any of the methods according to the present invention when the code is run on the computer and/or the digital signal processing means, respectively.

These and further aspects, details, advantages and features of the present invention will be described based on embodiments of the invention and by taking reference to the accompanying figures.

Figure 7:
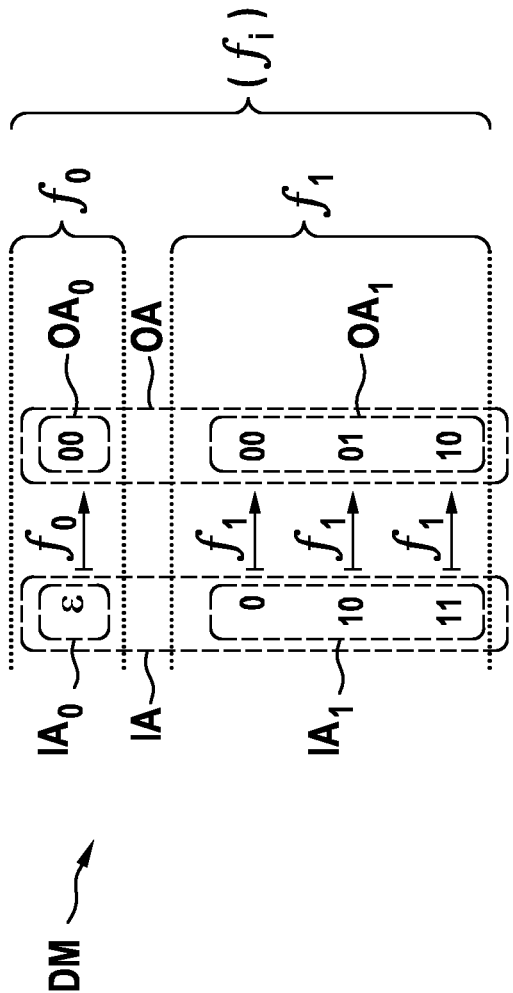
Figure 8:
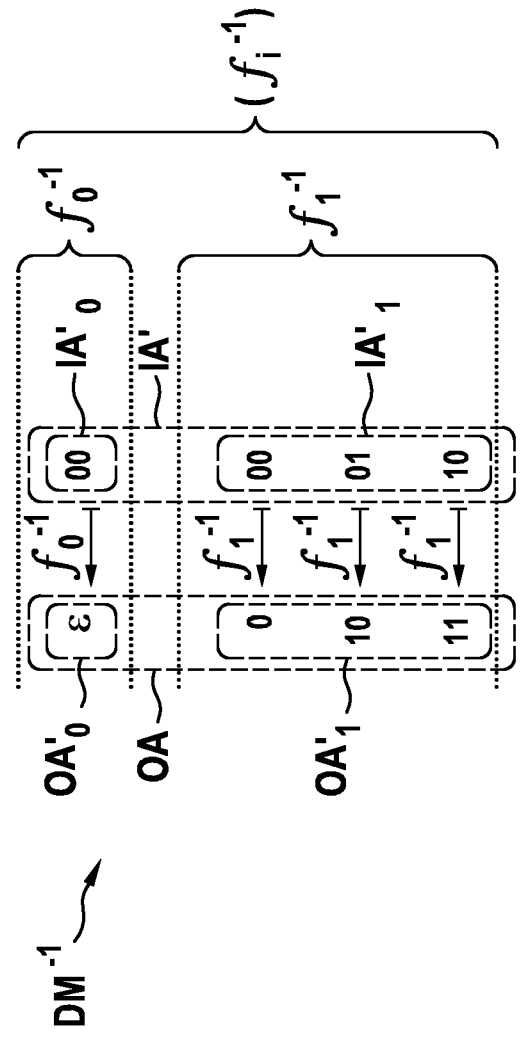

FIGS. 7 and 8 elucidate schematically a distribution matching process and a corresponding inverse distribution matching process based on a concrete family of distribution matching functions.

FIG. 9 depicts a table describing the action of the distribution matching process shown in FIG. 7.

In the following embodiments and the technical background of the present invention are presented in detail by taking reference to accompanying FIGS. 1 to 9. Identical or equivalent elements and elements which act identically or equivalently are denoted with the same reference signs. Not in each case of their occurrence a detailed description of the elements and components is repeated.

The depicted and described features and further properties of the invention's embodiments can arbitrarily be isolated and recombined without leaving the gist of the present invention.

Figure 1:
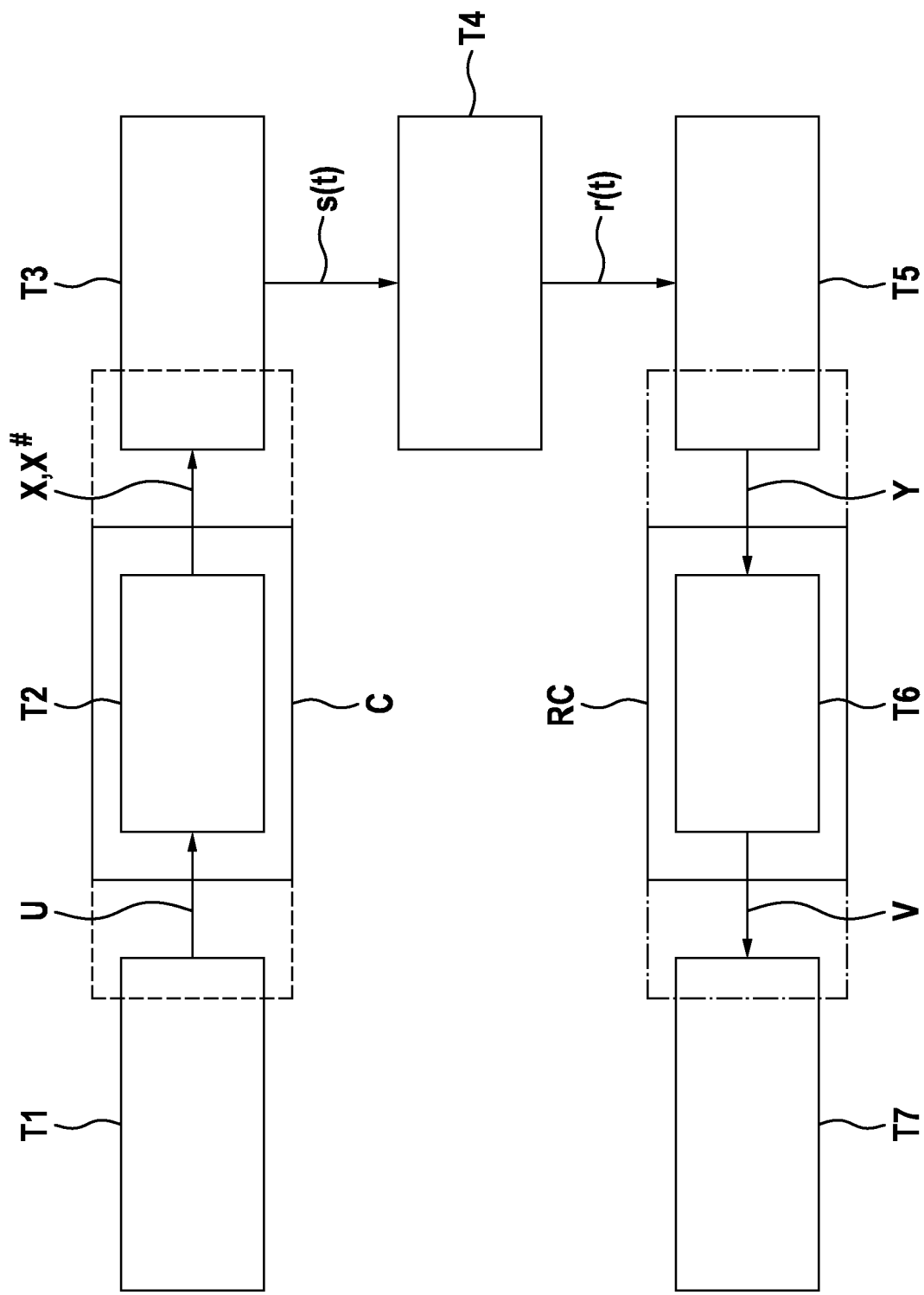
FIG. 1 is a block diagram for elucidating an embodiment of a data transmission and/or data reception system according to the present invention and the embedding of the methods for converting/reconverting a data signal embedded therein.

Before going into detail with respect to aspects of the methods for converting/reconverting a data signal and the methods for data transmission/reception reference is taken to FIG. 1 and its general view on systems and methods for data conversion/reconversion and/or data transmission/reception.

Therefore, FIG. 1 is a block diagram for elucidating embodiments of a data transmission and/or data reception system according to the present invention and the embedding of the methods for converting/reconverting a data signal embedded therein.

The scheme according to FIG. 1 generally follows the concept of coding and modulation in digital communication proposed in 1974 by Massey.

The scheme of FIG. 1 discloses a system T—being it a hardware structure, a configuration of a method or of processing units or a combination thereof—comprising (i) an information source unit T1 configured to provide a signal U to be converted and transmitted, an (ii) encoding unit T2 configured to receive and encode the signal U and to output an encoded signal X, (iii) a modulator unit T3 configured to receive and modulate the encoded signal X and to output a modulated signal s(t) for transmission over (iv) a transmission/reception waveform channel unit T4, (v) a demodulator unit T5 configured to receive the modulated signal s(t) in a form r(t) possibly distorted by the transmission channel unit T4 and to demodulate said signal in order to output a demodulated signal Y, (vi) a decoder unit T6 configured to receive and decode the demodulated signal Y and to output the decoded signal V, and (vii) an information sink unit T7 configured to receive the decoded signal V.

According to the present invention, the information source T1 and the information sink T7 may be any kind of information or signal sink or source, respectively. Any kind of storage medium may be used. Alternatively, any arbitrary other transmitting/receiving channel may be involved.

As already mentioned above, according to the present invention a method C for converting a data signal U and alternatively or additionally a method RC for reconverting a data signal Y are provided. These methods C and RC according to the present invention may embrace or be a part of the information encoding unit T2 and decoding unit T6, respectively. Additionally or alternatively, parts of the information source unit T1 and/or of the modulator unit T3 on the one hand and of the demodulator unit T5 and/or of the information sink unit T7 on the other hand may be realized, too.

Figure 2:
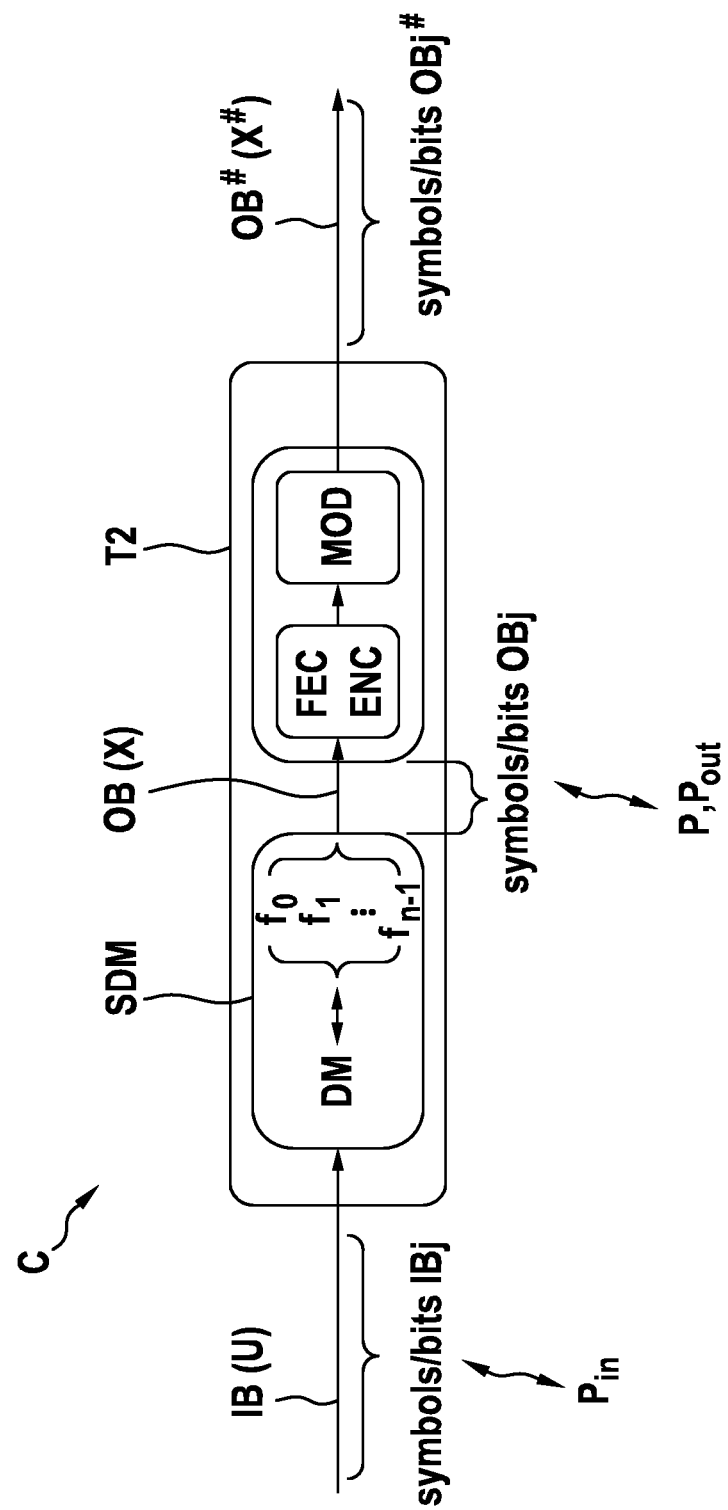
FIGS. 2 and 3 are block diagrams elucidating in more detail general aspects of the methods for converting and reconverting a data signal according to the present invention.
Figure 3:
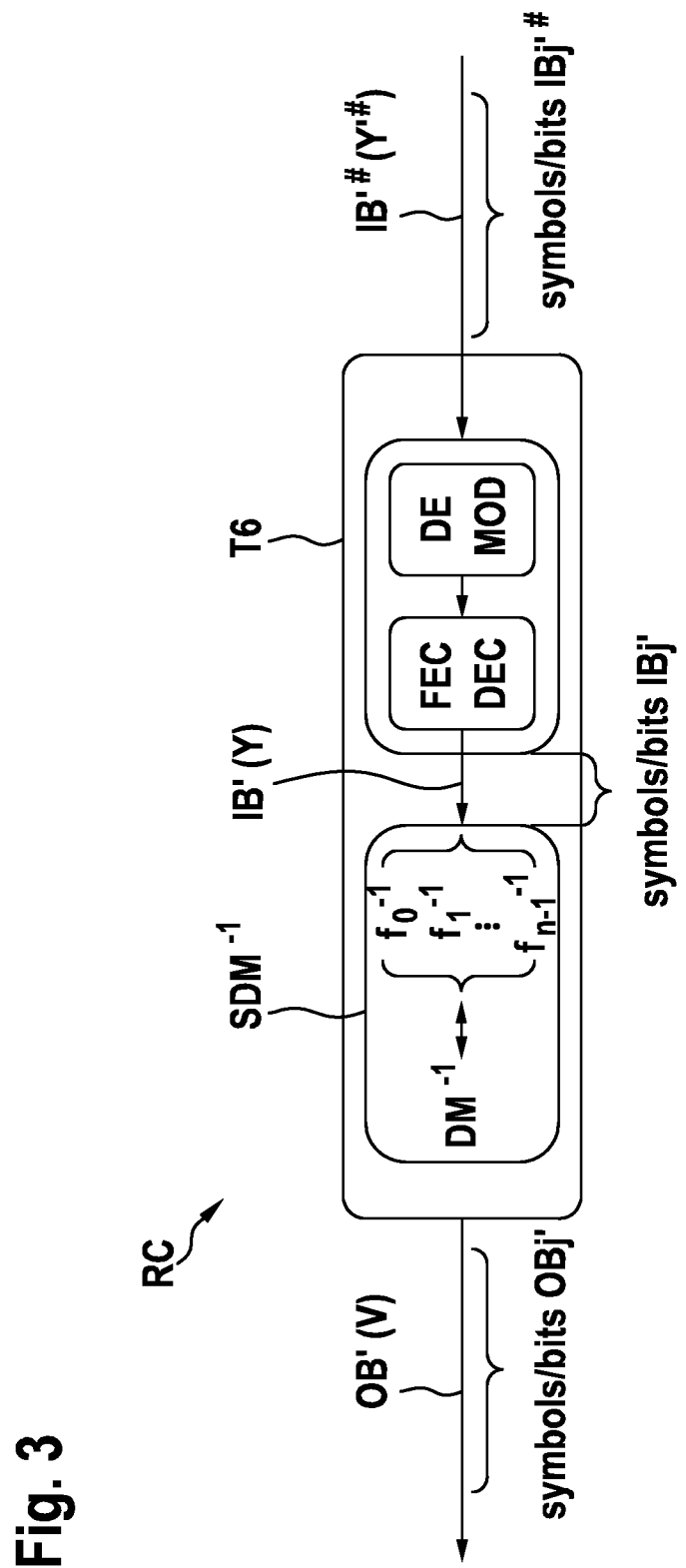

FIGS. 2 and 3 elucidate by means of block diagrams in more detail general aspects of the method C for converting a data signal U and of a method RC for reconverting a data signal Y according to the present invention.

The data signal U obtained from an information source unit T1 in the case shown in FIGS. 1 to 4 is represented by or identical to an input symbol stream IB which is not necessarily but may be a stream of binary input digits or input bits IBj. The input symbol stream IB may have a finite length or may be represented as a continuous flow of symbols.

Overall, FIGS. 1 to 3 describe the entire transmission/reception system T.

FIG. 2 further elucidates by means of a schematic block diagram a preferred embodiment of an encoding process or unit T2 realizing an aspect of the present invention and thereby the signal conversion C of the transmission or transmitter side.

An input symbol or bit stream IB being representative for a signal or data signal U to be converted and comprising a stream of input symbols or input bits IBj is provided to the encoding process or unit T2. The encoding process or unit T2 is configured to process the input symbols or bits IBj in order to generate and output an output symbol stream OB which is representative to the converted signal X of FIGS. 1 and 2 or a processed form $X^{\#}$ thereof and which comprises a stream of output symbols or output bits OBj or the respective processed output bits $OBj^{\#}$ of a respective processed form $OB^{\#}$ of the output symbol stream OB.

In the embodiment shown in FIG. 2 the encoding process or unit T2 is formed by a first or preceding distribution matching process or unit DM defined by a family $(f_i)_{i \in \{0, 1, \ldots, n-1\}}$ of distribution matching functions $f_i$. The distribution matching functions $f_i$ are selectable based on a set of selection rules and they are each configured in order to generate from input symbols or bits IBj and in particular from a partial sequence $IB^k$ of a number of k of input symbols IBj thereof a sequence $OB^{k'}$ of a number of k' of output bits or symbols OBj.

The numbers k and k' are natural numbers and their value may vary. Their ratio k/k' gives the rate or transmission rate R(t)=k/k' which may not be constant during the entire process, but which preferably shall approach or approximate a desired transmission rate R.

The output bits or symbols OBj are supplied to a forward error correction process or unit FEC followed by a modulation process or unit MOD.

The input symbols IBj are given according to an input distribution Pin in view of an input alphabet IA, whereas the output symbols OBj are distributed according to an output distribution Pout in view of an output alphabet OA underlying the distribution matching process DM.

Preferably, the output distribution Pout may empirically approximate a desired distribution P.

In order to establish such approximations with respect to the desired distribution P and the desired rate R, the distribution matching process DM and in particular the underlying family $(f_i)_{i \in \{0, 1, \ldots, n-1\}}$ of distribution matching functions $f_i$, the alphabets IA, IAi, OA, OAi, and/or the selection rules for selecting the distribution matching functions $f_i$ may be chosen accordingly.

In other words, the distribution matching functions $f_i$ each have assigned an input alphabet IAi and an output alphabet OAi.

As indicated above, the unions of the input alphabets IAi on the one hand and of the output alphabets OAi on the other hand may respectively consist of words with letters in the input alphabet IA and the output alphabet OA of the distribution matching process DM.

As the configuration of the distribution matching process DM shown in FIG. 2 is particularly capable of realizing streaming operation, such a distribution matching process DM based on a family $(f_i)_{i \in \{0, 1, \ldots, n-1\}}$ of distribution matching functions $f_i$ can be regarded as a streaming distribution matching process denoted by SDM.

The modulation process or unit MOD gives as an output symbol or bit sequences in time discrete form which are supplied to and transmitted by e.g. an optical transmission system OT which may be formed according to FIG. 1 by a modulator unit T3, a transmission/reception channel unit T4, and a demodulator unit T5, wherein the modulator unit T3 and the demodulator unit T5 are capable of digital/analog and analog/digital conversion/modulation, respectively.

FIG. 3 further elucidates by means of a schematic block diagram a preferred embodiment of a decoding process or unit T6 realizing an aspect of the present invention and thereby the signal (re)conversion RC of the reception or receiver side.

As indicated already above the signal Y to be converted and formed by input symbols or bits $IBj^{\#}$ is fed into a demodulator DEMOD followed by a forward error correction decoder FEC DEC. The resulting symbol or bit sequence IB' is then fed to an inverse distribution matcher $DM^{-1}$.

The inverse distribution matching process $DM^{-1}$ at the receiving side reflects the properties of the distribution matcher DM at the transmission side in an inverse manner. Consequently and as shown in FIG. 3, the inverse distribution matching process $DM^{-1}$ is defined based on a corresponding family $(f_i^{-1})_{i \in \{0, 1, \ldots, n-1\}}$ of inverse distribution matching functions $f_i^{-1}$ each having assigned a respective input alphabet IAi' and output alphabet OAi'.

The input alphabet IA of the streaming distribution matcher SDM at the transmission side and as defined above may be identified with the output alphabet OA' of the inverse streaming distribution matcher $SDM^{-1}$ at the receiving side. And vice versa, the output alphabet OA of the streaming distribution matcher SDM at the transmission side may be identified with the input alphabet IA' of the inverse streaming distribution matcher $SDM^{-1}$ at the receiving side.

Similar identifications may be made regarding the individual input and output alphabets IAi, OAi, IAi', OAi' of the individual distribution matching functions $f_i$ and inverse distribution matching functions $f_i^{-1}$.

By the concatenation of the processes DEMOD, FEC DEC and $DM^{-1}$ the input signal Y to be (re)converted and given by input symbols/bits $IBj^{\cdot}$ of the input symbol/bit stream $IB^{\#}$ is transformed into a reconverted output signal V given by output symbols/bits OBj' of the output symbol/bit stream OB'.

Figure 4:
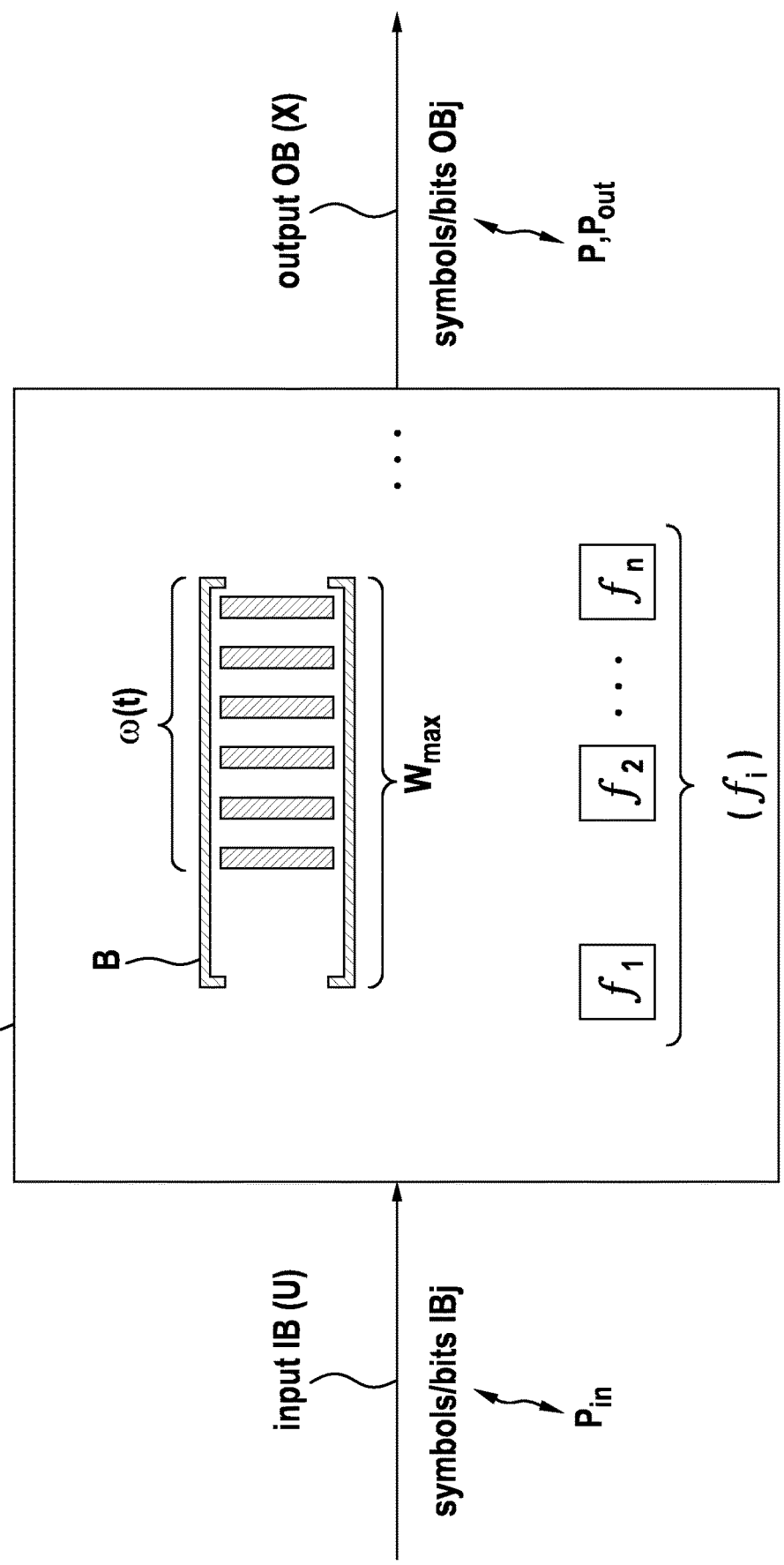
FIGS. 4 to 6 are diagrams elucidating in more detail aspects of a distribution matching process working in a streaming manner and based on a family of distribution matching functions.
Figure 5:
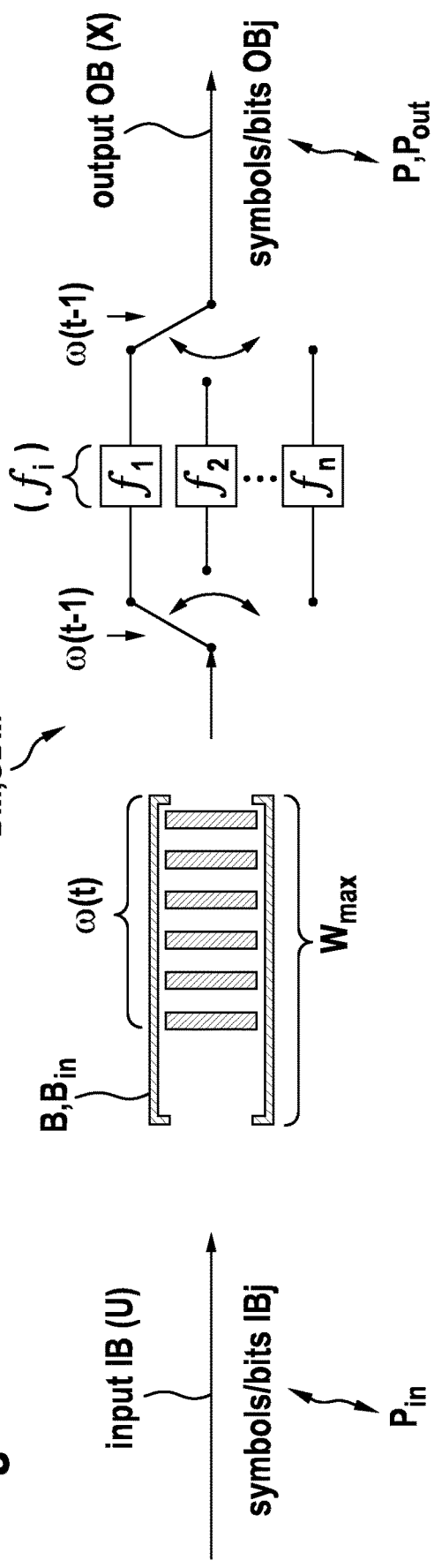
Figure 6:
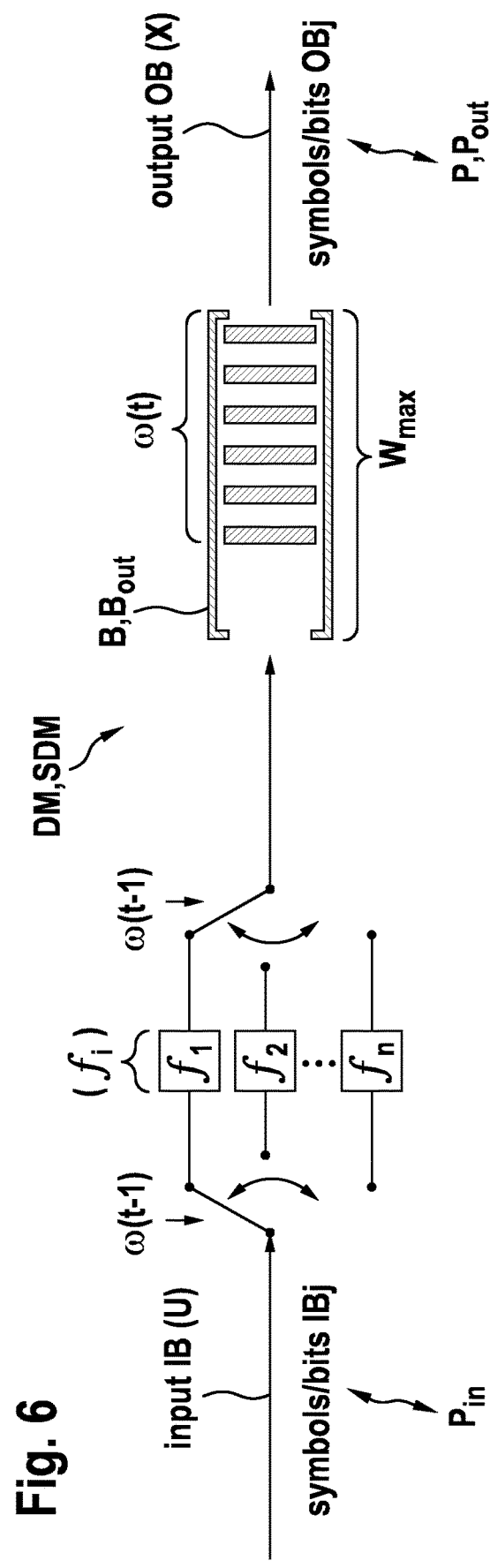

FIGS. 4 to 6 are diagrams elucidating in more detail aspects of a distribution matching process DM working in a streaming manner and based on a family $(f_i)_{i \in \{0, 1, \ldots, n-1\}}$ of distribution matching functions $f_i$.

Under the circumstances shown in FIGS. 4 to 6, the distribution matching process DM is a streaming distribution matching process SDM that may be based on a certain set of selection rules for selecting the individual distribution matching functions $f_i$ e.g. depending on the data conditions in view of the input symbol stream IB and the output symbol stream OB and/or processing conditions of the distribution matching process DM.

In the embodiment shown in FIGS. 4 to 6 a buffer B described by a time-dependent buffer state ω(t) is involved for designing the selection rules for selecting the individual distribution matching functions ω(t) underlying the distribution matching process DM.

In FIG. 4 a general buffer B is shown. FIGS. 5 and 6 show embodiments involving an input buffer Bin and an output buffer Bout, respectively.

In each case, the buffer state ω(t−1) of any of the buffers Bin, Bout at a past clock or instance of time t−1 is used for selecting the individual distribution matching function $f_i$ from the underlying family $(f_i)_{i \in \{0, 1, \ldots, n-1\}}$.

FIGS. 7 to 9 describe in more detail a concrete embodiment for a streaming distribution distribution matching functions $f_0$ and $f_1$ with respect to input alphabets IA0, IA1 and output alphabets OA0, OA1 with their words having letters in the input alphabet IA and the output alphabet OA of the entire streaming distribution matching process SDM.

FIG. 7 demonstrates the distribution matcher DM as such together with his matching functions $f_0$ and $f_1$, whereas FIG. 8 shows the inverse distribution matching process DM−1 with its family $(f_i)_{i \in \{0, 1, \ldots, n-1\}}$ inverse distribution matching functions $f_0^{-1}$ and $f_1^{-1}$.

From FIGS. 7 and 8 the correspondence of the input alphabets IA, IA0, IA1, IA', IA0', IA1' and output alphabets OA, OA0, OA1, OA', OA0', OA1' can be obtained.

In FIGS. 7 to 9 the input symbols IBj, IBj' and the output symbols OBj, OBj' are in each case given as binary bits or sequences thereof. The symbol c denotes the empty string.

In the following, these and additional aspects, features and/or properties of the present invention will be further elucidated:

The presented invention relates generally to communication systems, and more particularly to spectrally efficient transmission. The presented invention in particular relates to communication methods and systems and to techniques for generating sequences of symbols—e.g. from which constituting signals are to be transmitted—with desired distributions. With the measures suggested, it is possible to realize data transmission and reception with an increased degree of efficiency at reduced power requirements in particular suitable for a streaming operation.

In order to achieve a power efficient communication in a streaming manner—for instance over noisy channels—symbols to be transmitted within a signal are designed to follow a certain distribution on the one hand involving processes which are suitable for cooperating with a streaming architecture. In order to achieve this, data bits or more general data symbols need to be mapped to a symbol sequence with a desired distribution and the distribution and the transfer rate have to be realized in a certain manner. The mapping should be invertible, so that the original data symbols or bits can be recovered from the symbol sequence, for instance after the transmission and reception at a reception side.

Devices configured to realize such a mapping of original symbols or bits to a desired distribution of symbols or bits are called distribution matchers and they are denoted by the symbol DM.

The importance of the present invention can be better understood based on the following observations:

The global society currently faces a rapid growth of data traffic in the internet, which will continue in the coming decades. This puts a tremendous pressure on telecommunication companies, which need innovations to provide the required digital link capacities.

In order to increase the throughput, low-complexity and low-latency approaches for data transmission have gained major importance. This is particularly challenging for optics, where current research targets a transmission rate of more than 1 Tbit/s.

For forwarded error correction (FEC) one may employ spatially coupled, i.e., convolutional, low-density parity-check (LDPC) codes with windowed decoding.

This approach enables a streaming architecture, i.e. it allows to process chunks of transmitted data specified by the window size of the decoder to the receiver side without having to wait until the whole block has been received. This streaming architecture enables a very high throughput required by transceivers for fiber optic transmission.

Probabilistic amplitude shaping has gained a lot of interest in optics as one approach to meet the ever increasing demands.

For this a distribution matching process DM is needed to perform the transformation of uniformly distributed symbols or bits into channel symbols or bits with a desired distribution.

All approaches suggested so far—e.g. constant composition distribution matching (CCDM), shell mapping distribution matching (SMDM) and the like do not integrate well with a streaming architecture.

CCDM operates block wise and requires a long block length to work well.

SMDM is designed for high dimensional constellation shaping and has a large rate loss when used as a conventional matcher.

Furthermore, the existing implementation of CCDM uses floating point arithmetic and SMDM requires the multiplication of large integers, which may make the implementation of CCDM and SMDM in high-throughput transceivers difficult.

In order to realize the gains observed in field trials in practical optical transmission systems, distribution matching processes with low complexity real-time processing are required that integrate well with a FEC streaming architecture.

According to the present invention a streaming architecture is proposed for a distribution matching processes DM, which for instance may use as components simple variable-length distribution matching functions $f_i$ which can be operated using only basic operations such as binary addition, binary comparison, and shifts.

In the following a streaming distribution matching process SDM as a distribution matching process DM according to an embodiment of the present invention is described:

DM Parameters for Streaming Operation

Finite input alphabet IA.
Finite output alphabet OA.
Target rate R of bits/output symbol.
Target distribution P on the output alphabet OA.
A set or family $(f_i)_{i \in \{0, 1, \ldots, n-1\}}$ of distribution matching functions implementing mappings from input strings $IB^k$ to output strings $OB^{k'}$.

Target Rate

The target rate R and target distribution P may relate via the entropy H according to the following relation (1)

$$R \approx H(P) = \sum_{OBj \in OA} P(OBj)[-\log_2 P(OBj)]. \qquad (1)$$

The streaming distribution matching process SDM may receive a steady stream of input symbols IBj∈IA in the input alphabet IA which may be uniformly distributed with an input distribution Pin.

The streaming distribution matching process SDM is configured to output a steady stream of output symbols OBj∈OA with an empirical output distribution Pout. The empirical output distribution Pout may be given as Pout(OBj)=(number of occurrences of the symbol OBj in the output stream)/(total number of symbols in the output stream) (2)

The empirical distribution Pout should be close to a desired target distribution P according to:

Pout≈P.

In every round t=1, 2, 3, . . . , the streaming distribution matching process SDM applies one of the distribution matching functions $f_i$ of the underlying family $(f_i)_{i \in \{0, 1, \ldots, n-1\}}$ that maps short strings $IB^k$ of input symbols IBj to short strings $OB^{k'}$ of output symbols OBj. The input strings $IB^k$ and the output strings $OB^{k'}$ may be of variable lengths k and k'.

For instance, for variable input-length, fixed output-length, geometric Huffman codes (GHC) can be used as distribution matching algorithms.

For fixed input-length, variable output-length other architectures exist.

The index t=1, 2, 3, . . . may represent a clock signal or the time.

The target rate R may for example be achieved as follows: The streaming distribution matching process SDM may use internally two distribution matching functions f1 and f2 rate R1 and R2 such that R1≤R and R2≥R. The streaming distribution matching process SDM switches between the two distribution matching functions f1 and f2. On the long run, it uses the distribution matching function f1 for the fraction of time and it uses the distribution matching function f2 for the fraction of time (1−λ) so that on average, the rate is exactly R, i.e. relation (3) holds:

R=λ·R1+(1−λ)·R2. (3)

After a given round, clock or time t, $n_{in}(t)$ shall denote the accumulate number of processed input symbols IBj and $n_{out}(t)$ shell denote the accumulated number of processed output symbols OBj.

Define the buffer state ω(t) of an underlying buffer B, Bin, Bout according to

ω(t):=R·$n_{out}(t)$−$n_{in}(t)$.

Then the concrete distribution matching function f(t) may be chosen based on said buffer state ω(t), for example according to the following relation (4)

$$f(t) := \begin{cases} f_1 \Leftrightarrow \omega(t-1) \leq W \\ f_2 \Leftrightarrow \omega(t-1) > W \end{cases}$$ (4)

wherein W is some threshold value for the buffer state ω(t).

Some permitted range Wmin≤ω(t)≤Wmax may be imposed on the buffer state ω(t), for instance with Wmin=0 and Wmax>0 or Wmax=0 and Wmin<0.

A situation with ω(t)≥Wmin may be achieved by the following strategy:

If ω(t)=Wmin, use in round t+1 the trivial distribution matching function $f_0$ mapping the empty string ε onto a dummy output sequence y of positive length.

In other words:
(a) Process no additional input symbols in round t+1.
(b) Output a dummy sequence of output symbols in round t+1.

A situation with ω(t)≤Wmax may be achieved by the following strategy:

If ω(t)=Wmax, use in round t+1 a distribution matching function f(t) with instantaneous or current rate R(t) of at least R, i.e. for each pair of input x and output y the distribution matching function f shall fulfill the following relation (5):

R(t)=k/k'=length(x)/length(y)≥R (5)

EXAMPLE

Consider the following example:
Binary input and output alphabets IA and OA are given by IA:={0, 1} and OA:={0, 1}.
The target rate R shall be R:=0.5 [input bits/output bits].
The target distribution P shall be defined by P(0):=0.89 and P(1):=0.11. It shall be noted that the entropy H of the target distribution P fulfills the relation H(P)= R=0.5.
The buffer state permitted range is given by 0≤ω(t) ≤Wmax with Wmax=1.

The implementation of the streaming distribution matching process SDM may be based on distribution matching functions $f_0$ and $f_1$ elucidated in the context of FIGS. 7 and 9.

It shall be noted that the distribution matching function f1 has the instantaneous rate R=0.5 for the input string $OB^k$=0 and it has the instantaneous or current rate R(t)=1 for the input strings $OB^k$ having configurations 10 and 11.

Based on the buffer state ω(t−1) at the past time or clock t−1, one may select the current distribution matching function f(t) according to rule (6) as follows:

$$f(t) := \begin{cases} f_0 \Leftrightarrow \omega(t-1) = 0 \\ f_1 \Leftrightarrow \omega(t-1) = 1 \end{cases}$$ (6)

In table 1 shown in FIG. 9 the example input sequence $IB^k$=011010 is encoded.

The empirical output distribution Pout is given by Pout (0)=10/12≈0.833, Pout(1)=2/12≈0.167, close to the desired target distribution P.

In particular, one has

H(Pout)=0.65, (7)

that is, the empirical entropy H exceeds the rate by 0.15 bits. This exceedance is called rate loss. It can be made arbitrarily small by using distribution matching processes DM and distribution matching functions with more code words.

A general construction scheme for the distribution matching functions is described in the publication "Matching dyadic distributions to channels" by Böcherer and Mathar published in Proc. Data Compression Conf., March 2011, pages 23 to 32.

ADDITIONAL DESCRIPTION OF THE FIGURES

FIG. 4 depicts the black box model of the streaming distribution matching process SDM. An input stream IB being representative for the signal U to be converted is processed into an output stream OB using a bank or family $(f_i)_{i\in\{0, 1, \ldots, n-1\}}$ of distribution matching functions $f_i$ and a state ω(t) of an internal buffer B.

FIG. 5 depicts a possible implementation for the streaming distribution matching process SDM. The distribution matching function $f_i$ is chosen and activated by the state ω(t) of the buffer B which in this case is an input buffer Bin, i.e. a buffer at the input side of the streaming distribution matching process SDM.

The input stream IB is passed on to the active distribution matching function that reads the input stream IB or input sequence $IB^k$ thereof. As soon as a dictionary word—i.e. an element of the input alphabet IAi underlying the selected distribution matching function—of the code of the active distribution matching function is identified, the selected and activated distribution matching function outputs the corresponding code word.

As code words and/or dictionary words are of different lengths, the stream between selected active distribution matching function and buffer B, Bin has a variable rate R, which is taken care of by the buffer B, Bin. The output of the buffer B, Bin is the output stream OB and has length k'.

FIG. 6 depicts another possible implementation of a streaming distribution matching process SDM according to the present invention. The input symbol stream IB fills a buffer B which in this case is an output buffer Bout, i.e. a buffer at the output side of the streaming distribution matching process SDM. The active distribution matching function is chosen based on the state ω(t) of the buffer B, Bin.

The active distribution matching function requests as many symbols or bits as necessary from the buffer B to identify a dictionary word based on the input alphabet IA, IAi. As dictionary words may differ in length, there is a variable rate stream from the buffer B, Bout to the active selected distribution matching function. In this case a variable-to-fixed length distribution matching code ensures a constant length k' at the output of the output symbol stream OB.

Integration with Probabilistic Amplitude Shaping (PAS)

The proposed configuration or architecture is not limited to the simple setting described above and it may integrate well with PAS or any other form of forethought error correction encoding:

The output alphabet OA, OAi can be the amplitudes of a amplitude shift keying (ASK) constellation or of a quadrature amplitude modulation (QAM) constellation.

The target distribution P can be chosen as an amplitude distribution as required by the PAS transceiver.

More generally, the output alphabet OA, OAi is not restricted to a binary set. Construction rules for variable length distribution matching functions for non-binary output alphabets OA, OAi are readily available as described in the publication already mentioned above.

Transmitter Side Aspects

The streaming distribution matching process SDM may work in rounds or clocks t with t=1, 2, 3, 4, . . . .

The streaming distribution matching process SDM may have an input alphabet IA and an output alphabet OA, which are not necessarily binary.

For each time, clock or round t the streaming distribution matching process SDM ensures selection and application of a suitable distribution matching function f(t) on received input strings as partial input symbol sequences $IB^k$ of length k in order to generate and output strings as partial output symbol sequences $OB^{k'}$ of length k'.

The alphabets IA, IAi, OA, OAi may be different or not and they may be binary or not.

For each time, clock or round t the distribution matching function f(t) may be chosen according to some underlying selection rule.

The streaming distribution matching process or SDM output OB has an output distribution Pout which is approximately the desired target distribution P.

The input string, i.e. the partial input symbol sequence $IB^k$, the output string, i.e. the partial output symbol sequence $OB^{k'}$ or both may be of variable length, i.e. the respective distribution matching function f(t) may be of fixed-to-fixed length, variable-to-fixed length, fixed-to-variable length or variable-to-variable length type.

After the t-th time, clock or round t the streaming distribution matching process SDM has processed a number of $n_{in}(t)$ input symbols IBj and a number of $n_{out}(t)$ output symbols OBj.

The streaming distribution matching process SDM operates at a desired target rate R describing the ratio of the number of input symbols IBj and of the number of output symbols OBj.

If a buffer B, Bin, Bout is used a corresponding buffer state may fulfill the relation $$\omega(t) := R \cdot n_{out}(t) - n_{in}(t)$$

The streaming distribution matching process SDM may then have a permitted buffer range according to Wmin<w (t)<Wmax with given margins Wmin and Wmax.

The maximum buffer size Wmax can be chosen large, e.g. as Wmax=100 or above. Also the minimum buffer size Wmin can be chosen small, e.g. as Wmin=−100 or below.

The output rate R and the output distribution Pout may relate as H(Pout) R.

The distribution matching function f(t) at time, clock or round t may be chosen as a function of a past of a state ω(t−1).

The streaming distribution matching process SDM may be combined with probabilistic amplitude shaping PAS.

The streaming distribution matching process SDM may be combined with a forward error correction FEC streaming architecture.

A plurality of streaming distribution matching processes SDM may be configured in parallel and may be coordinated via a shared buffer B.

At the receiver side, the streaming inverse distribution matching process $DM^{-1}$ and the underlying inverse streaming distribution matching functions have an inverse and invertible structure when compared to the underlying distribution matching process DM and its distribution matching functions.

According to the present invention a novel approach for a distribution matching process DM is provided which is called streaming distribution matching and denoted by SDM. The new approach is appropriate and suitable for high-throughput streaming architectures. According to the present invention, the proposed streaming distribution matching process SDM appropriate for becoming distribution matching component of future high-throughput transceivers e.g. for realizing the probabilistic shaping.

In addition to the foregoing description of the present invention, for an additional disclosure explicit reference is taken to graphic representation of FIGS. 1 to 9.

LIST OF REFERENCE SIGNS

B buffer
Bin (input) buffer

Bout (output) buffer
C signal conversion section/process/unit/system
DEMOD (QAM) demodulator
DM distribution matching process/unit
$DM^{-1}$ inverse/inverted distribution matching process/unit
FEC DEC forward error correction decoder
FEC ENC forward error correction encoder
$f_i$ distribution matching function
$f_i^{-1}$ inverse distribution matching function)
$(f_i)_{i \in \{0, 1, \ldots, n-1\}}$ family of distribution matching functions
$(f_i^{-1})_{i \in \{0, 1, \ldots, n-1\}}$ family of inverse distribution matching functions
H(Q) Entropy of a distribution Q
IA input alphabet (at the transmitter side)
IA' input alphabet (at the receiver side)
IB input symbol/bit stream (at the transmitter side)
IB' input symbol/bit stream (at the receiver side)
$IB^\#$ (pre-)processed form of input symbol/bit stream (at the receiver side)
IBj input symbol/bit, j=1, 2, . . . . (at the transmitter side)
IBj' input symbol/bit, j=1, 2, . . . . (at the receiver side)
$IB^k$ partial input symbol/bit sequence of length k (at the transmitter side)
$IB'^{k'}$ partial input symbol/bit sequence of length k' (at the receiver side)
$IB^{\# \ k'}$ (pre-)processed form of partial input symbol/bit sequence of length k' (at the receiver side)
k input/output length
k' input/output length
MOD (QAM) modulator
$n_{in}(t)$ accumulated number of processed input symbols IBj at time/clock t
$n_{out}(t)$ accumulated number of processed output symbols OBj at time/clock t
OA output alphabet (at the transmitter side)
OA' output alphabet (at the receiver side)
OB output symbol/bit stream (at the transmitter side)
OB' output symbol/bit stream (at the receiver side)
$OB^\#$ processed form of output symbol/bit stream
OBj output symbol/bit, j=1, 2, . . . . (at the transmitter side)
OBj' output symbol/bit, j=1, 2, . . . . (at the receiver side)
$OBj^\#$ processed form of output symbol/bit (at the transmitter side)
$OB^{k'}$ partial output symbol/bit sequence of length k' (at the transmitter side)
$OB'^k$ partial output symbol/bit sequence of length k (at the receiver side)
OT optical transmission method/system
P (desired) output distribution
Pin input distribution
Pout (achieved) output distribution
r(t) sent signal, after channel T4 and before demodulator T5
R desired transmission rate
R(t) current/instantaneous transmission rate, R=k/k'
R1 rate
R2 rate
RC signal reconversion section/process/unit/system
s(t) signal to be sent, after modulator T3 and before channel T4
SDM streaming distribution matcher
t time, clock, clock value
T transmission/reception method/system
T1 information source unit
T2 encoding unit
T3 modulator unit
T4 transmission/reception (waveform) channel unit
T5 demodulator unit
T6 decoder unit
T7 information sink unit
U signal from source T1, before encoder T2
V signal to sink T7, after decoder T6
X signal, after encoder T2 and before modulator T3
$X^\#$ processed form of signal
Y signal, after demodulator T5 and before decoder T6
ε empty string/sequence of symbols
ω buffer state

The invention claimed is:

1. A method (C) for converting a data signal (U), the method comprising processes of
providing an input symbol stream (IB) of input symbols (IBj), the input symbol stream (IB) being representative for the underlying data signal (U) to be converted; and
applying to consecutive partial input symbol sequences ($IB^k$) of a number of k consecutive input symbols (IBj) covering said input symbol stream (IB), a distribution matching process (DM) to generate and output a final output symbol stream (OB) of consecutive output symbols (OBj) or a preform thereof,
wherein
k is a natural number;
the distribution matching process (DM) is based on and/or comprises a family $((f_i)_{i \in \{0, 1 \ldots, n-1\}})$ of a number (n) of distribution matching functions ($f_i$);
the action of the distribution matching process (DM) is achieved by acting with one of said distribution matching functions ($f_i$) selected from said family $((f_i)_{i \in \{0, 1, \ldots, n-1\}})$ on said partial input symbol sequences ($IB^k$); and
selecting a distribution matching function ($f_i$) from said family $((f_i)_{i \in \{0, 1 \ldots, n-1\}})$ is at least one of based on and controlled by a set of rules comprising at least one selection rule.

2. The method (C) according to claim 1, wherein at least one of the processes of
(i) providing the input symbol stream (IB),
(ii) applying said distribution matching process (DM),
(iii) selecting a distribution matching function ($f_i$) from said family $((f_i)_{i \in \{0, 1 \ldots, n-1\}})$, and
(iv) acting with a distribution matching function ($f_i$) on the input symbol stream (IB) is performed in at least one of a continuously clocked manner and a streaming manner.

3. The method (C) according to claim 1, wherein the at least one selection rule is based on at least one of
(a) said input symbol stream (IB), said partial input symbol sequences ($IB^k$) thereof, and/or one or plural input symbols (IBj) already received or read as input,
(b) said output symbol stream (OB), partial sequences thereof ($OB^k$), and/or one or plural output symbols (OBj) already transferred or written as output,
(c) one present and/or at least one past state (ω) of an underlying input buffer (B, Bin),
(d) one present and/or at least one past state (c) of an output buffer (B, Bout),
(e) a given distribution (Pin) of the input symbols (IBj),
(f) a distribution (P, Pout) of the output symbols (OBj) achieved or to be achieved, and
(g) a rate (R) as a ratio of the number of received input symbols (IBj) and the number of transferred output symbols (OBj) achieved or to be achieved, wherein a particular rate (R) is equal or proportional to the empirical entropy (H) of the distribution (P, Pout) of the output symbols (OBj).

4. The method (C) according to claim 1, wherein at least one of
said distribution matching process (DM) has or is based on an Input alphabet (IA) and an output alphabet (OA), and
each of said distribution matching functions ($f_i$) of said family (($f_i$)$_{i \in \{0, 1, \ldots, n-1\}}$) has or is based on an input alphabet (IAi) and an output alphabet (OAi), which are distinct for each of said distribution matching functions ($f_i$).

5. The method (C) according to claim 1, wherein at least one of the distribution matching process (DM), the distribution matching functions ($f_i$), and the at least one selection rule is s configured such that
the output symbol stream (OB) at least approximates a desired underlying distribution (P) and/or fulfills at least approximatively a desired rate (R) when compared to the input symbol stream (IB),
the input symbol stream (IB) is processed in the form of the partial Input symbol sequences (IB$^k$) having t number k of consecutive input symbols (IBj) covering said input symbol stream (IB), and/or
the output symbol stream (OB) is output in the form of partial sequences (OB$^{k'}$) having a number k' of consecutive output symbols (OBj) covering said output symbol stream (OB), with k' being a natural number.

6. The method (C) according to claim 1, wherein at least one of the distribution matching process (DM), the distribution matching functions ($f_i$), and the at least one selection rule is configured such that a desired transmission rate R, a current accumulated number $n_{in}(t)$ of processed input symbols (IBj)$_1$ and a current accumulated number $n_{out}(t)$ of processed output symbols (OBj) at a given time or clock t fulfill the following relation $$W\text{min} \leq R \cdot n_{out}(t) - n_{in}(t) \leq W\text{max},$$

wherein Wmin and Wmax are predefined and fixed threshold values describing a minimum and a maximum buffer filling state, respectively.

7. The method (C) according to claim 1, wherein the distribution matching process (DM) is followed
by an forward error correction encoding process (FEC ENC) within a probabilistic amplitude shaping process (PAS), and
by a modulation process (MOD), in particular a QAM modulation process,
in this order and to generate and output a processed form (OB$^\#$) of the output symbol stream (OB) having processed output symbols (OBj$^\#$) and/or in the form of processed output symbol sequences (OB$^{k'\#}$) of length k', wherein k' is a natural number.

8. The method (C) according to claim 1, wherein the distribution matching process (DM) formed by a plurality of partial distribution matching processes, which are configured to act in parallel and/or based on a shared input buffer unit.

9. The method (C) according to claim 1,
wherein the process of providing the input symbol stream (IB) comprises at least one of
recalling the input symbol stream (IB) from a storage medium or from a symbol generation process, and
receiving, demodulating and/or decoding a signal being representative for or conveying the input symbol stream (IB).

10. The method (C) according to claim 1,
wherein said input symbol stream (IB) and/or the output symbol stream (OB) are at least partially formed and/or represented by binary bits.

11. A data transmission and reception system (T) with a data transmission section configured to perform the method (C) of claim 1.

12. The data transmission and reception system (T) according to claim 11,
comprising a processing unit configured to perform the method (C).

13. The data transmission and reception system (T) according to claim 11, wherein the system (T) further comprises a data reception section configured to perform a method (RC) of reconverting a data signal (Y), the method (RC) comprising processes of
providing an input symbol stream (IB') of input symbols (IBj'), the Input symbol stream (IB') being representative for an underlying data signal (Y) to be reconverted or a derivative thereof; and
applying to said input symbol stream (IB'), or to a derivative thereof, an inverse distribution matching process (DM$^{-1}$) to generate and output a final output symbol stream (OB'),
wherein
the inverse distribution matching process (DM$^{-1}$) is based on and/or comprises a family (($f_i$)$_{i \in \{0, 1, \ldots, n-1\}}$) of a number (n) of inverse distribution matching functions ($f_i^{-1}$);
the action of the inverse distribution matching process (DM$^{-1}$) is achieved by acting with one of said inverse distribution matching functions ($f_i^{-1}$) selected from said family (($f_i^{-1}$) on the input symbol stream (IB'); and
selecting an inverse distribution matching function ($f_i^{-1}$) from said family ((($f_i$)$_{i \in \{0, 1, \ldots, n-1\}}$) is inherently realized, based on, and/or controlled by the underlying set of rules comprising at least one selection rule for the family (($f_i$)$_{i \in \{0, 1, \ldots, n-1\}}$) of distribution matching functions ($f_i$) for the distribution matching process (DM).

14. The data transmission and reception system (T) according to claim 13,
wherein the distribution matching process (DM) and the inverse distribution matching process (DM$^{-1}$) are inverse to each other.

15. The data transmission and reception system (T) of claim 13,
comprising a processing unit configured to perform the method (RC).

16. A method (RC) for reconverting a data signal (Y), the method (RC) comprising processes of
providing an input symbol stream (IB') of input symbols (IBj'), the input symbol stream (IB') being representative for an underlying data signal (Y) to be reconverted or a derivative thereof; and
applying to said input symbol stream (IB'), or to a derivative thereof, an inverse distribution matching process (DM$^{-1}$) to generate and output a final output symbol stream (OB'),
wherein
the inverse distribution matching process (DM$^{-1}$) is based on and/or comprises a family (($f_i$)$_{i \in \{0, 1, \ldots, n-1\}}$) of a number (n) of inverse distribution matching functions ($f_i^{-1}$);
the action of the inverse distribution matching process (DM$^{-1}$) is achieved by acting with one of said inverse distribution matching functions ($f_i^{-1}$) selected from said family $((f_i)_{i \in \{0, 1, \ldots, n-1\}})$ on the input symbol stream (IB'); and selecting an inverse distribution matching function ($f_i^{-1}$) from said family $(((f_i)_{i \in \{0, 1, \ldots, n-1\}})$ is inherently realized, based on, and/or controlled by an underlying set of rules comprising at least one selection rule for an underlying family $((f_i)_{i \in \{0, 1, \ldots, n-1\}})$ of distribution matching functions ($f_i$) for a distribution matching process (DM) at a transmitter side.

17. The method (RC) according to claim 16, wherein at least one of the processes of
  (i') providing the input symbol stream (IB'),
  (ii') applying said inverse distribution matching process (DM$^{-1}$),
  (iii') selecting an inverse distribution matching function ($f_i^{-1}$) from said family $((f_i)_{i \in \{0, 1, \ldots, n-1\}})$, and
  (iv') acting with an inverse distribution matching function ($f_i^{-1}$) on the input symbol stream (IB')
  is performed in at least one of a continuously clocked manner and streaming manner.

18. The method (RC) according to claim 16, wherein at least one of
  said inverse distribution matching process (DM$^{-1}$) has or is based on an input alphabet (IA') and an output alphabet (OA'), which are identical to an output alphabet (OA) and an input alphabet (IA), respectively, of an underlying distribution matching process (DM) at a transmitter side; and
  each of said inverse distribution matching functions ($f_i^{-1}$) of said family $((f_i)_{i \in \{0, 1, \ldots, n-1\}})$ has or is based on an input alphabet (IAi') and an output alphabet (OAi'), which are distinct for each of said inverse distribution matching functions ($f_i^{-1}$) underlying the inverse distribution matching process (DM$^{-1}$) and/or which are distinct to respective output alphabets (OAi, OA) and input alphabets (IAi, IA) of underlying distribution matching functions ($f_i$) for a distribution matching process (DM) at a transmitter side.

19. The method (RC) according to claim 16, wherein at least one of the inverse distribution matching process (DM$^{-1}$), the inverse distribution matching functions ($f_i^{-1}$), and the at least one selection rule of the underlying set of rules is configured such that
  the output symbol stream (OB') at least approximates a uniform distribution and/or fulfills at least approximatively a desired rate (R') when compared to the input symbol stream (IB'),
  the input symbol stream (IB') is processed in the form of partial sequences (IB'$^{k'}$) having a number k' of consecutive input symbols (IBj') covering said input symbol stream (IB'), with k' being a natural number, and/or
  the output symbol stream (OB') is output in the form of partial sequences (OB'$^k$) having a number k of consecutive output symbols (OBj') covering said output symbol stream (OB'), with k being a natural number.

20. The method (RC) according to claim 16,
  wherein the inverse distribution matching process (DM$^{-1}$) follows
    a demodulation process (DEMOD) and/or a QAM demodulation, and
    a forward error correction decoding process (FEC DEC) and/or within an inverse probabilistic amplitude shaping process (PAS$^{-1}$),
  in this order.

21. The method (RC) according to claim 16, wherein the inverse distribution matching process (DM$^{-1}$) is formed by a plurality of partial inverse distribution matching processes, which are configured to act in parallel and/or based on a shared output buffer unit.

22. The method (RC) according to claim 16,
  wherein the process of providing the input symbol stream (IB') comprises at least one of
    recalling the input symbol stream (IB') from a storage medium or from a symbol generation process, and
    receiving, demodulating, and/or decoding a signal being representative for or conveying the input symbol stream (IB').

23. The method (RC) according to claim 16,
  wherein said input symbol stream (IB') and/or the output symbol stream (OB') are at least partially formed and/or represented by binary bits.

\* \* \* \* \*

UNITED STATES PATENT AND TRADEMARK OFFICE
CERTIFICATE OF CORRECTION

PATENT NO. : 10,826,648 B2
APPLICATION NO. : 16/477634
DATED : November 3, 2020
INVENTOR(S) : Georg Böcherer, Patrick Schulte and Fabian Steiner It is certified that error appears in the above-identified patent and that said Letters Patent is hereby corrected as shown below:

In the Claims

Claim 3, Column 16, Line 53, after "thereof" please delete "$(OB^k)$" and insert --$(OB^{k'})$-- therefor.

Claim 3, Column 16, Line 57, after "past state" please delete "(c)" and insert --($\omega$)-- therefor.

Claim 5, Column 17, Line 14, after "rule" please delete "is s configured" and insert --is configured-- therefor.

Claim 5, Column 17, Line 20, after "partial" please delete "Input symbol" and insert --input symbol-- therefor.

Claim 5, Column 17, Lines 20-21, after "having" please delete "t number k" and insert --the number k-- therefor.

Claim 5, Column 17, Line 24, after "sequences" please delete "$(OB^k)$" and insert --$(OB^{k'})$-- therefor.

Claim 6, Column 17, Lines 32-33, after "symbols" please delete "$(IBj)_i$" and insert --$(IBj)$,-- therefor.

Claim 8, Column 17, Line 56, after "process" please delete "(DM) formed" and insert --(DM) is formed-- therefor.

Claim 13, Column 18, Line 18, after "(IBj'), the" please delete "Input symbol" and insert --input symbol-- therefor.

Claim 13, Column 18, Line 34, after "said family" please delete "$((f_i^{-1})$" and insert --$((f_i^{-1})_{i\in\{0,1...,n-1\}})$-- therefor.

Claim 13, Column 18, Line 36, after "said family" please delete "$(((f_i))$" and insert --$((f_i))$-- therefor.

Signed and Sealed this
Nineteenth Day of January, 2021

Andrei Iancu
*Director of the United States Patent and Trademark Office*

Claim 16, Column 18, Line 63, after "comprises a" please delete "family (($f_i$)" and insert --family (($f_i^{-1}$)-- therefor.

Claim 16, Column 19, Line 2, after "said" please delete "family (($f_i$)" and insert --family (($f_i^{-1}$)-- therefor.

Claim 16, Column 19, Line 5, after "said" please delete "family (($f_i$)" and insert --family (($f_i^{-1}$)-- therefor.

Claim 17, Column 19, Line 17, after "said" please delete "family (($f_i$)" and insert --family (($f_i^{-1}$)-- therefor.

Claim 18, Column 19, Line 32, after "said" please delete "family (($f_i$)" and insert --family (($f_i^{-1}$)-- therefor.